(12) United States Patent
Pruefer et al.

(10) Patent No.: US 8,697,530 B2
(45) Date of Patent: Apr. 15, 2014

(54) DRAIN/SOURCE EXTENSION STRUCTURE OF A FIELD EFFECT TRANSISTOR WITH REDUCED BORON DIFFUSION

(75) Inventors: Ekkehard Pruefer, Dresden (DE); Ralf Van Bentum, Moritzburg (DE); Klaus Hempel, Dresden (DE); Stephan Kruegel, Reichenberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1700 days.

(21) Appl. No.: 11/674,362

(22) Filed: Feb. 13, 2007

(65) Prior Publication Data
US 2008/0001191 A1     Jan. 3, 2008

(30) Foreign Application Priority Data
Jun. 30, 2006  (DE) .......................... 10 2006 030 261

(51) Int. Cl.
*H01L 21/336*     (2006.01)

(52) U.S. Cl.
USPC ........... 438/305; 438/211; 438/696; 438/981; 257/E21.247; 257/E21.409

(58) Field of Classification Search
USPC .................... 438/201, 211, 981, 305, 696; 257/E21.247, E21.409
See application file for complete search history.

(56) References Cited

U.S. PATENT DOCUMENTS 3,574,010 A * 4/1971 Brown et al. ................. 438/217
5,552,332 A    9/1996 Tseng et al.

* cited by examiner

*Primary Examiner* — Leonard Chang
(74) *Attorney, Agent, or Firm* — Amerson Law Firm, PLLC

(57) ABSTRACT

By modifying the dielectric liner for a spacer structure so as to exhibit an enhanced diffusion blocking characteristic, for instance by incorporating nitrogen, the out-diffusion of P-dopants, such as boron, into the dielectric material may be significantly reduced. Consequently, transistor performance, especially of P-type transistors, may be significantly enhanced while nevertheless a high degree of compatibility with conventional techniques may be maintained.

20 Claims, 9 Drawing Sheets

DRAIN/SOURCE EXTENSION STRUCTURE OF A FIELD EFFECT TRANSISTOR WITH REDUCED BORON DIFFUSION

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures, requiring highly doped shallow junctions.

2. Description of the Related Art

The manufacturing process for integrated circuits continues to improve in several ways, driven by the ongoing efforts to scale down the feature sizes of the individual circuit elements. Presently and in the foreseeable future, the majority of integrated circuits are, and will be, based on silicon devices, due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions, i.e., source and drain regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence so as to obtain a high dopant concentration having a profile that varies laterally and in depth. The introduction of a high dose of dopants into a crystalline substrate area, however, generates heavy damage in the crystal structure and, therefore, one or more anneal cycles are required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal. Moreover, besides the dopant activation and the curing of crystal damage, dopant diffusion may also occur during the annealing, which may lead to a loss of dopant atoms in the extension regions, thereby "blurring" the dopant profile. With reference to FIGS. 1a-1c, a typical conventional process flow for forming a conventional field effect transistor will now be described in order to explain the problems involved in more detail.

FIG. 1a schematically shows a cross-sectional view of a transistor structure 100 at an intermediate manufacturing stage. The transistor structure 100 comprises a substrate 101, typically a silicon substrate or a substrate including a silicon layer, in which an active region 103 may be defined by an isolation structure (not shown), such as a shallow trench isolation (STI). A gate electrode 105 is formed above the active region 103 and is separated therefrom by a gate insulation layer 106. A first spacer structure 102 is formed on sidewalls of the gate electrode 105 to provide a desired offset during an implantation process 107 for defining source and drain extension regions 108 in the active region 103. It should be noted that the previously mentioned gate length is, in FIG. 1a, the lateral dimension of the gate electrode 105. The portion of the active region 103 underlying the gate insulation layer 106 represents a channel region 104 disposed between the source and drain extension regions 108.

A typical process flow for forming the transistor structure 100 as shown in FIG. 1a may comprise the following process steps. After formation of isolation structures by sophisticated photolithography, etch and deposition methods, an implantation sequence may be performed to generate a required dopant profile (not shown) within the active region 103. Thereafter, the gate insulation layer 106 is formed by advanced oxidation and/or deposition techniques with a required thickness that is adapted to the gate length of the gate electrode 105. Then, the gate electrode 105 is patterned from an appropriate material, such as polysilicon, by means of advanced photolithography and etch techniques. Next, the ion implantation process 107 may be performed to introduce dopants of a required conductivity type into the active region 103 to thereby form the extension regions 108. If the transistor structure 100 represents a P-channel transistor, a P-type dopant, such as boron, may be used. As previously noted, scaling the gate length of the gate electrode 105 also requires the extension regions 108 to be provided as shallow doped regions with a depth, indicated as 109, in the range of approximately 8-50 nm for a gate length in the range of approximately 30-100 nm. Thus, the ion implantation process 107 is performed with relatively low energy, depending on the type of dopants used, and with a moderately high dose to provide the required high dopant concentration within the extension regions 108.

FIG. 1b schematically shows the transistor structure 100 in an advanced manufacturing stage. A second sidewall spacer structure 110 is provided adjacent to the first spacer structure 102, which may typically be formed of a silicon dioxide liner 110B and a silicon nitride spacer 110A. The spacer structure 110 may be formed by self-aligned deposition and anisotropic etch techniques in order to act as an implantation mask for a subsequent ion implantation sequence 112 to form source and drain regions 111. The overall transistor performance may be affected by the spacer structures 102 and 110, since the relative permittivity of the dielectric material positioned close to the gate electrode 105 and close to the extension regions 108 may have an influence on the degree of charge carrier accumulation within the extension regions 108 due to the capacitive coupling to the gate electrode 105. Hence, it is advantageous to form a significant portion of the spacer structures 110 and 102, for instance the spacers 110A, of silicon nitride, which has a higher dielectric constant compared to silicon dioxide, which thus serve as an efficient etch stop layer during the patterning of the respective silicon nitride layer.

As previously noted, a high dopant concentration is required in the source and drain regions 111 as well as in the extension regions 108 so that severe crystal damage is generated during the implantation sequences 107, 112. Therefore, generally a heat treatment such as a rapid thermal anneal is required, on the one hand, to activate the dopant atoms and to substantially re-crystallize the damaged structure in the source and drain regions 111 and the extension regions 108.

During the heat treatment and possibly during other treatments at elevated temperatures in later manufacturing stages, the dopants, and in particular boron, may readily diffuse, thereby compromising the transistor performance due to a loss of dopant atoms in sensitive device areas, such as the extension regions 108. On the other hand, efficiently re-establishing the crystalline structure within the source and drain regions 111 and the extension regions 108 may require relatively high temperatures over a sufficiently long time period, which may, however, unduly increase the dopant diffusion. Especially as device dimensions are scaled to a gate length of 60 nm and even less, the issue of degraded transistor performance, due to a reduced conductivity owing to insufficiently activated dopants and/or a dopant profile blurred by diffusion, is even more important.

FIG. 1c schematically shows the transistor structure 100 after completion of the manufacturing process. Metal silicide regions 115 are formed on top of the gate electrode 105 and the drain and source regions 111, which may comprise nickel, cobalt, tungsten, platinum and the like, or any other appropriate refractory metal. Contact plugs 113 are formed in contact with the drain and source regions 111 to provide electrical contact to further circuit elements (not shown) or other interconnect lines (not shown). The contact plugs 113 may typically be comprised of tungsten and other appropriate barrier and adhesion materials.

Forming the metal silicide regions 115 may typically comprise depositing an appropriate refractory metal and subsequently performing a suitably designed anneal cycle to obtain the metal silicide regions 115 having a significantly lower sheet resistance compared to silicon, even when heavily doped. The contact plugs 113 may be formed by depositing a dielectric material 116, such as silicon dioxide in combination with silicon nitride, and patterning the same to form vias that are subsequently filled with a metal, wherein typically a thin barrier and adhesion layer is formed prior to filling in the bulk metal.

During operation of the transistor structure 100, a voltage may be applied to the contact plugs 113 and a corresponding control voltage to the gate electrode 105 so that, in the case of a P-channel transistor, a thin channel forms in the channel region 104 substantially comprised of holes, indicated by 114, wherein as previously noted the transistor performance, among others, significantly depends on the transition resistance from the channel 104 to the extension regions 108 and from the sheet resistance in the regions 108, since substantially no highly conductive metal silicide is formed in this area. Owing to the complex manufacturing process for forming the extension regions 108 and the drain and source regions 111, i.e., insufficiently cured lattice damage and restricted concentration of activated dopants, in combination with a loss of dopants caused by dopant diffusion, particularly of a readily diffusing species, such as boron, the device performance may be degraded, especially for extremely scaled transistor elements 100, thereby partially offsetting the advantages that are generally obtained by scaling the circuit elements of an integrated circuit.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that enables the reduction of dopant loss in transistor devices by reducing the out-diffusion of specified dopant species from respective extension regions of transistor devices into the neighboring dielectric materials. As previously explained, the performance of sophisticated field effect transistors may be affected by the configuration of the respective sidewall spacer structures, since the capacitive coupling may influence the charge carrier transport mechanism in the respective extension regions, thereby also affecting the drive current capability thereof. It has been recognized that, in conventional spacer architectures, in which a silicon dioxide liner in combination with a silicon nitride spacer of higher relative permittivity is used, a significant loss of dopant into the dielectric liner material may be observed, in particular for boron-doped extension regions, thereby contributing to a reduced transistor performance. For this reason, the subject matter disclosed herein provides a reduced diffusion rate from an extension region into the neighboring dielectric material by appropriately designing the sidewall spacer structure, substantially without affecting the characteristics with respect to the relative permittivity thereof. To this end, in some illustrative embodiments, the material characteristics of the dielectric liner may be appropriately modified or adjusted so as to reduce the diffusion of the specified dopant species from the extension region into the dielectric liner material. Consequently, the transistor performance may be enhanced, especially for transistor elements including a high amount of boron dopant, as this dopant species exhibits a moderately high diffusivity.

According to one illustrative embodiment disclosed herein, a method comprises forming a dielectric liner above a substrate including a first gate electrode formed above an active region and separated therefrom by a gate insulation layer. The method further comprises modifying the dielectric liner so as to reduce a probability for a dopant species in the active region to diffuse into the dielectric liner. Finally, a sidewall spacer for the first gate electrode is formed by using the dielectric liner as an etch stop layer.

According to another illustrative embodiment disclosed herein, a method comprises forming a sidewall spacer structure for a gate electrode of a first transistor by using a dielectric liner as an etch stop layer. The dielectric layer comprises at least a portion causing a lower diffusivity of a specified dopant species compared to a diffusivity of the specified dopant species in silicon dioxide.

According to yet another illustrative embodiment disclosed herein, a transistor device comprises a gate electrode formed next to a channel region and a gate insulation layer formed between the gate electrode and the channel region. Furthermore, the transistor device comprises a spacer structure formed adjacent to the gate electrode and connecting to an extension region, wherein the spacer structure comprises a spacer element and a dielectric liner that is in contact with the extension region. Furthermore, at least a portion of the dielectric liner provides a rate of diffusion of a specified dopant species from the extension region into the dielectric liner that is less than a rate of diffusion of the specified dopant species for a silicon dioxide liner.

BRIEF DESCRIPTION OF THE DRAWINGS

The disclosure may be understood by reference to the following description taken in conjunction with the accompanying drawings, in which like reference numerals identify like elements, and in which.

Figure 1A:
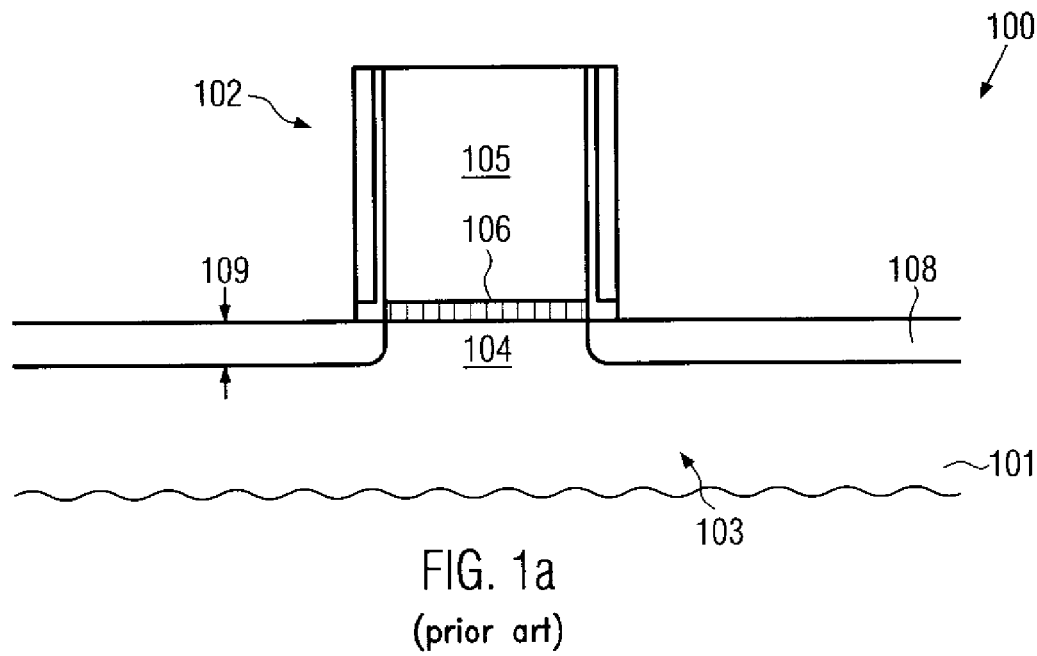
FIGS. 1a-1c schematically illustrate a transistor element formed in accordance with conventional techniques, wherein a silicon dioxide liner material is used as an etch stop layer for patterning silicon nitride spacer elements.
Figure 1B:
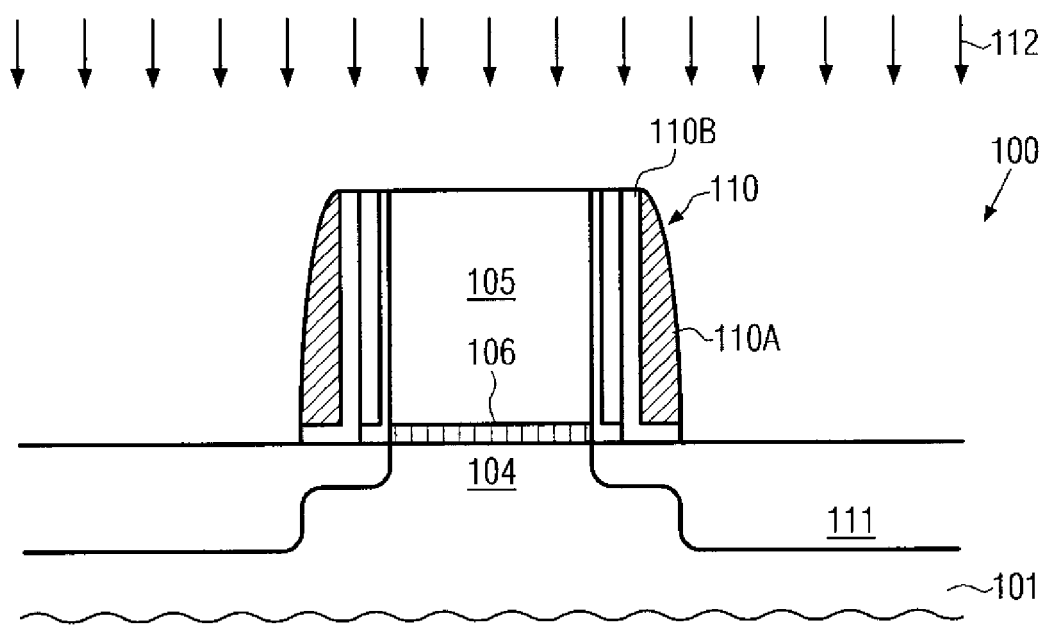
Figure 1C:
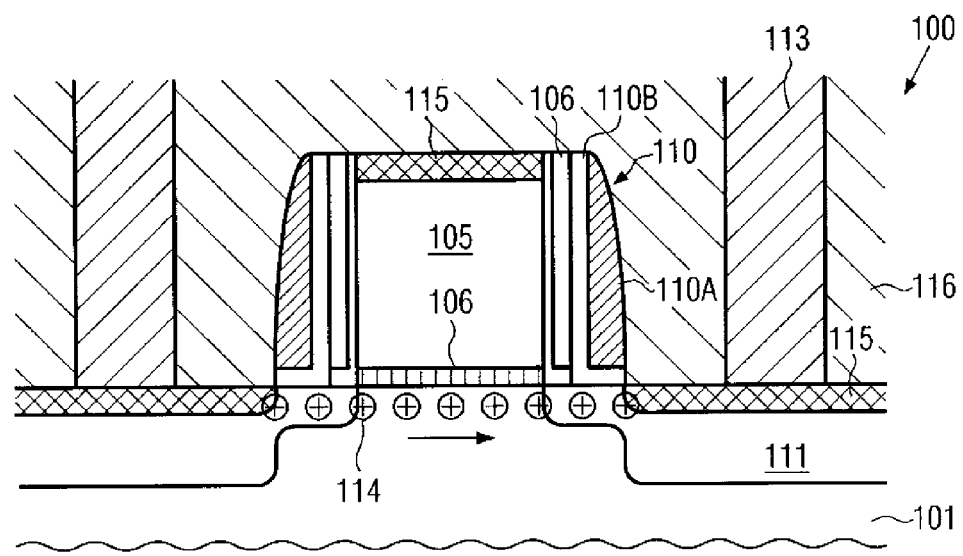

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for increasing the diffusion blocking characteristics of a sidewall spacer structure of a gate electrode for sophisticated transistor elements while substantially maintaining or even increasing the overall moderately high permittivity of conventional sidewall spacer structures. For this purpose, a mechanism is incorporated into a sidewall spacer structure for reducing the rate of diffusion from an extension region into the adjacent dielectric material of the spacer structure, wherein, in some illustrative embodiments, the respective diffusion blocking characteristics of a liner material, typically used as an etch stop layer, may be appropriately adjusted to substantially maintain a required degree of etch selectivity while nevertheless significantly altering the diffusivity of a specified dopant species, such as boron, which typically exhibits the highest diffusivity of typically used dopant species.

In other illustrative embodiments, the dopant gradient between an extension region and the adjacent sidewall spacer structure may be significantly reduced or may even be inverted in order to reduce the net diffusion rate from the extension region into the dielectric material or even provide a higher dopant concentration in the adjacent dielectric material. As previously explained, especially for highly scaled transistor devices, shallow PN junctions are required, thereby necessitating sophisticated implantation and anneal techniques in order to provide a high dopant concentration and a high degree of dopant activation. Due to the high dopant concentration, a corresponding high dopant gradient may not even exist at the respective PN junctions but also at the interface to the adjacent spacer structure, thereby promoting, in conventional transistor designs, a significant out-diffusion of dopant material into the dielectric, which may significantly increase the series resistance of the extension regions. Moreover, a reliable dielectric material of moderately high permittivity may be advantageously positioned as close to the gate electrode and the extension region as possible, while nevertheless a reliable patterning process for the spacer structure may be guaranteed. Consequently, in conventional strategies, a very thin silicon dioxide layer may be used as a dielectric liner material, whereas silicon nitride having an increased relative permittivity may be used for the actual spacer elements, wherein unfortunately the silicon dioxide may not efficiently block diffusion of specific dopant species and may particularly cause a significant migration of boron atoms into the silicon dioxide material, thereby reducing the conductivity of the extension region. Consequently, by providing an efficient mechanism for reducing the diffusion of boron into the adjacent spacer structure, i.e., into the adjacent liner material while substantially maintaining the required etch characteristics, a high degree of compatibility with well approved process techniques may be achieved while also substantially maintaining the dielectric characteristics of the sidewall spacer structure.

It should be appreciated that the subject matter disclosed herein may be highly advantageous in the context of sophisticated transistor elements, which may have critical dimensions, i.e., a gate length, of 100 nm and significantly less, such as 50 nm and less, since here a certain loss of dopant atoms in the respective extension regions may significantly contribute to a performance degradation. However, the principles disclosed herein may also be applied to transistor elements having less critical characteristics in order to significantly improve performance and reliability thereof. Consequently, unless specifically pointed out in the description or the appended claims, the present invention should not be considered as being restricted to a specific transistor configuration and technology node.

Figure 2A:
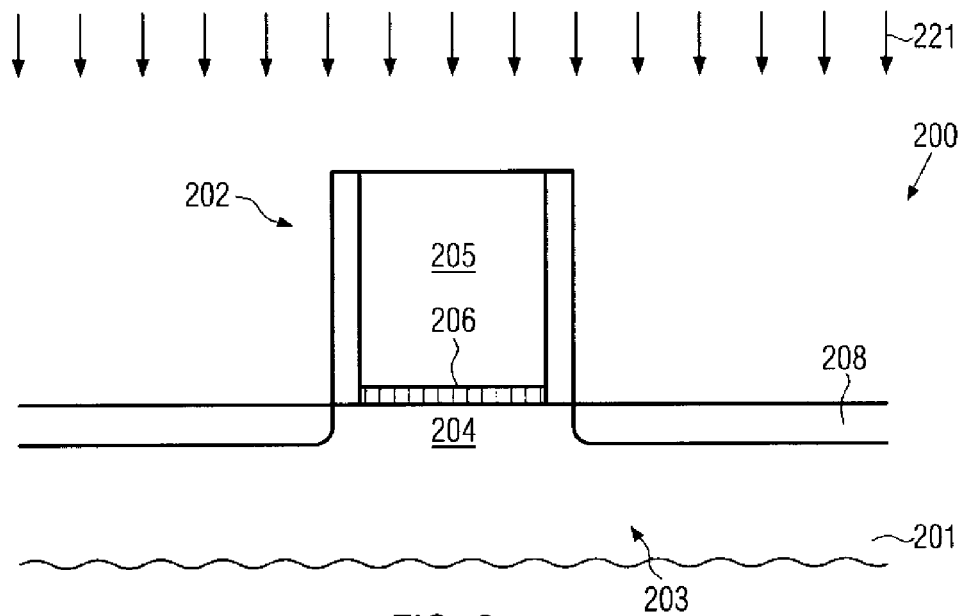
FIGS. 2a-2d schematically illustrate cross-sectional views of a transistor element in which a dielectric liner for a sidewall spacer structure is modified so as to exhibit an increased diffusion barrier characteristic in accordance with illustrative embodiments disclosed herein.

FIG. 2a schematically illustrates a transistor element 200 comprising a substrate 201, which may represent any appropriate carrier material for forming thereon transistor elements, possibly in combination with other circuit elements, mechanical components, optical components and the like. For example, the substrate 201 may represent an appropriate carrier material having formed thereon a substantially crystalline semiconductor material for forming therein an active region 203, i.e., a semiconductor region comprising one or more dopant species so as to appropriately modify and configure the conductivity therein. In some illustrative embodiments, the substrate 201 may represent a carrier material having formed thereon a silicon-based semiconductor layer, since the vast majority of complex integrated circuits are presently, and will be in the foreseeable future, formed on the basis of silicon. It should be appreciated that a silicon-based semiconductor material may also include other components, such as germanium, carbon and the like, wherein nevertheless a significant portion, for instance more than approximately 50 atomic percent, of silicon atoms may be present. In other illustrative embodiments, the transistor 200 may represent a circuit element formed on the basis of other semiconductor materials, such as any II-VI semi-conductor compounds or III-V semiconductor materials. In other illustrative embodiments, the substrate 201 may represent a silicon-on-insulator (SOI) substrate, in which a crystalline semiconductor layer may be formed on a buried insulating layer (not shown) to provide increased device performance due to reduced parasitic capacitances and the like associated with an SOI architecture. In this case, the active region 203 may represent a semiconductor region that is substantially completely isolated from other circuit elements. In this manufacturing stage, the transistor 200 may further comprise a gate electrode 205 formed on a respective gate insulation layer 206, separating the gate electrode 205 from a channel region 204. Furthermore, a sidewall spacer structure 202 may be formed on sidewalls of the gate electrode 205, wherein the spacer structure 202 may be comprised of silicon nitride including a silicon oxide liner (not shown), or any other appropriate configuration for acting as a respective implantation mask for forming extension regions 208 by an ion implantation process 221. The transistor 200 as illustrated in FIG. 2a may be formed on the basis of the processes as are also described with reference to the device 100 as shown in FIG. 1a.

Figure 2B:
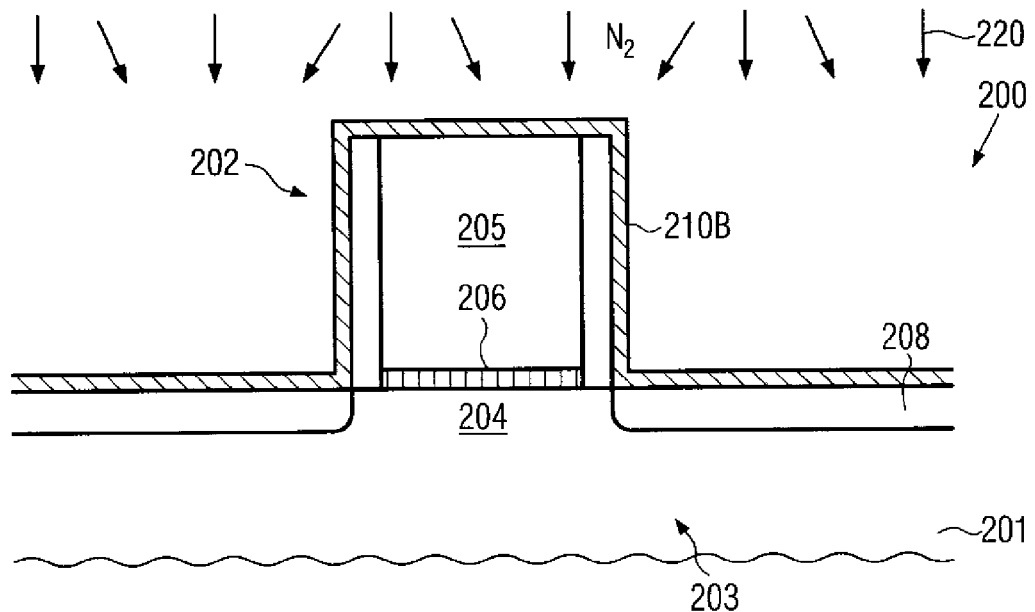

FIG. 2b schematically illustrates the transistor device 200 in a further advanced manufacturing stage. A dielectric liner 210B may be formed on the active region 203, i.e., on the extension regions 208, and may also cover the gate electrode 205 including the spacer structure 202. In one illustrative embodiment, the dielectric liner 210B comprises silicon dioxide with a thickness in the range of several nm to 20 nm or more, depending on the device requirements. As previously explained, in sophisticated applications, a reduced thickness of a material having a reduced relative permittivity may be advantageous in order to more closely position a respective "high-k" dielectric material to the extension region 208 and the gate electrode 205. In this case, a thickness of the dielectric liner 210B may range from approximately 3-10 nm. Contrary to conventional strategies, the dielectric liner 210B may have, at least in a portion thereof, significantly different characteristics compared to a pure silicon dioxide layer in view of its diffusion blocking characteristic with respect to a specified dopant species. A thermally grown silicon dioxide may exhibit an increased density and thus may impart a reduced diffusivity to a specified dopant species, such as boron. For other types of silicon dioxide, for instance deposited on the basis of plasma enhanced or thermal chemical vapor deposition (CVD), a varying degree of density and a different structure and amount of foreign atom species may be obtained, which may also result in different, typically increased, characteristics with respect to the diffusivity of a dopant species. Nevertheless, it should be appreciated that the dielectric liner 210B, even if it comprises a significant amount of silicon dioxide, may have a higher diffusion blocking effect for otherwise the same conditions compared to any silicon dioxide material, even if formed by thermal oxidation. In one illustrative embodiment, the dielectric liner 210B is characterized by its diffusion blocking behavior in respect to boron such that, in this embodiment, the dielectric liner 210B has a higher diffusion blocking characteristic for boron diffusion compared to any silicon dioxide layer within a temperature range of approximately up 1300° C. In one illustrative embodiment, the dielectric liner 210B may comprise nitrogen, which may significantly reduce the diffusivity of a plurality of dopant species within the material of the dielectric liner 210B. It should be appreciated that the contents of nitrogen within the dielectric liner 210B may, however, be significantly less compared to a "conventional" silicon nitride material so that a significant degree of etch selectivity with respect to silicon nitride material is still maintained. For example, the nitrogen contents may be less than approximately 20 atomic percent.

A typical process flow for forming the transistor 200 as shown in FIG. 2b may comprise the following processes. In one illustrative embodiment, the dielectric liner 210B may be deposited as a silicon dioxide material on the basis of well-established plasma enhanced or thermal CVD techniques. During the deposition of the silicon dioxide material, respective process parameters may be controlled so as to obtain a highly conformal material layer. Thereafter, a surface modification process 220 may be performed, for instance, in some illustrative embodiments, as a nitridation process using a plasma-containing ambient for incorporating a specified amount of nitrogen into the dielectric liner 210B. For this purpose, process parameters such as plasma pressure, temperature, bias power and the like may be appropriately adjusted in order to incorporate the nitrogen into the layer 210B.

For example, the transistor 200 may be introduced into a nitrogen-containing plasma ambient, wherein at least one process parameter is controlled to adjust a nitrogen ion density within the plasma ambient to a required level. For instance, a high frequency power required to establish the plasma ambient and the temperature thereof may be selected and the pressure of the plasma ambient is then controlled to adjust the ion density. Since, for instance, the pressure of the plasma ambient is precisely and reproducibly adjustable by corresponding equipped vacuum sources, an appropriate nitrogen ion concentration may be established in the plasma ambient in a reliable and rapid fashion. Accordingly, the nitridation rate may be controlled with high precision and, thus, the amount of nitrogen ions incorporated into the layer 210B may be controlled, while the number of nitrogen atoms penetrating the underlying region may also be maintained low. To this end, the pressure in the plasma ambient may, depending on the further process parameters, such as high frequency power and temperature in the plasma ambient, be adjusted to a relatively high level so that the corresponding nitridation rate is relatively low. For example, for an effective high frequency power in the range of approximately 50-500 watts and a temperature in the range of approximately 60-500° C., an initial pressure is set to a range of approximately 10 mTorr to 1 Torr. In some illustrative embodiments, the layer 210B may be provided with a reduced initial thickness to incorporate the nitrogen, and, during or after the nitrogen incorporation, the layer 210B may be formed with its finally desired thickness.

As previously explained, in sophisticated applications, the layer thickness of the base layer of the liner 210B may range from only a few nanometers to several nanometers in view of the overall relative permittivity of the sidewall spacer structures still to be formed on the basis of the dielectric liner 210B. Moreover, the dopant concentration in the extension regions 208, as well as the crystallinity thereof, may also be important aspects with respect to the overall transistor performance. Thus, undue incorporation of nitrogen into the extension region 208 may be reduced by appropriately selecting the plasma parameters to substantially restrict an average penetration depth substantially to the thickness of the layer 210B. In other illustrative embodiments, the thickness of the dielectric liner 210B may be adjusted during the respective deposition process so as to significantly exceed the desired target thickness such that a corresponding modification process 220 may be performed with relaxed process margins with respect to the penetration depth of nitrogen. Consequently, undue penetration of nitrogen into the extension regions 208 may be reduced. Thereafter, the modification process 220 may comprise an additional well-controllable etch step so as to reduce the layer thickness of the liner 210B to the desired target value. For this purpose, any appropriate well-controllable etch techniques may be used, such as isotropic wet and dry chemical etch recipes, an atomic layer etch process, wherein a substantially self-limiting etch reaction may be generated and the like. Consequently, a desired amount of nitrogen, for instance approximately 1-20 atomic percent, may be incorporated into the liner 210B, thereby endowing the liner 210B with the desired diffusion blocking characteristics with respect to a plurality of dopant species, such as boron and the like.

Figure 2C:
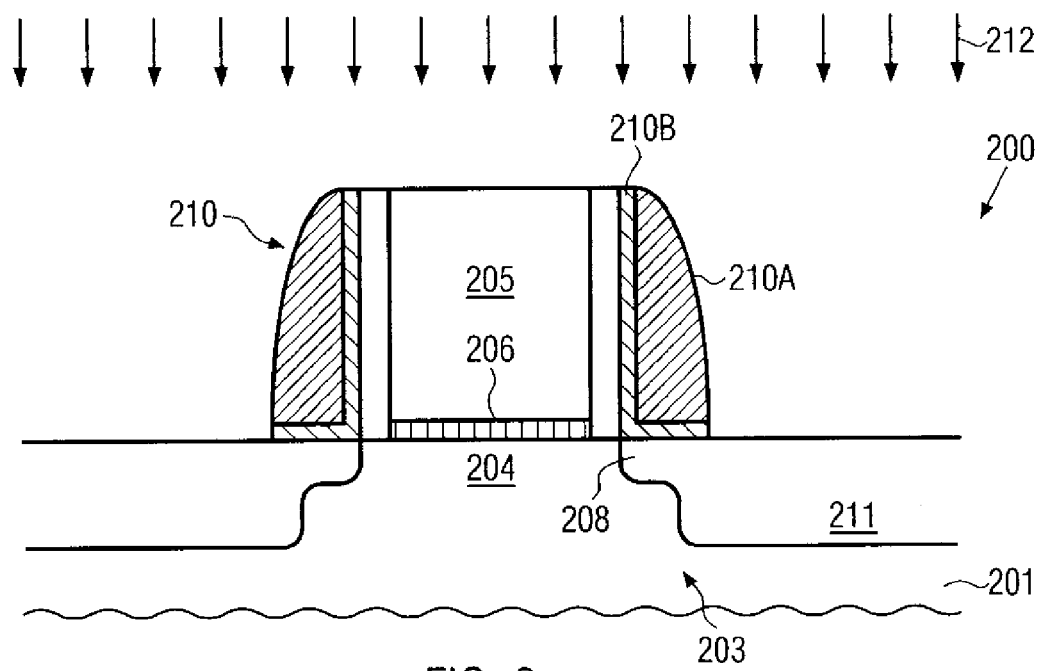

FIG. 2c schematically illustrates the transistor 200 in a further advanced manufacturing stage. The device 200 comprises a spacer structure 210 including the dielectric liner 210B and a spacer element 210A, which may be comprised of a dielectric material having a moderately high relative permittivity compared to silicon dioxide. In one illustrative embodiment, the spacer 210A may be comprised of silicon nitride. Moreover, respective drain and source regions 211 may be formed adjacent to the extension regions 208, wherein, in one illustrative embodiment, the drain and source regions 211 and the extension regions 208 may comprise a high concentration of a P-type dopant, which in one illustrative embodiment is represented by boron.

Typically, the transistor 200 as shown in FIG. 2c may be formed by depositing a spacer layer in a highly conformal manner on the basis of well-established techniques, such as plasma enhanced CVD, thermal CVD and the like. For example, silicon nitride may be deposited on the basis of plasma enhanced CVD, followed by an anisotropic etch process on the basis of well-established recipes, wherein the dielectric liner 210B acts as an efficient etch stop material. Thereafter, an implantation process 212 may be performed in order to position the respective dopant material for defining the drain and source regions 211 on the basis of the spacer structure 210. Prior to the implantation process 212 or afterwards, any exposed portions of the dielectric liner 210B may be removed by an appropriately designed selective etch process on the basis of well-established recipes.

Figure 2D:
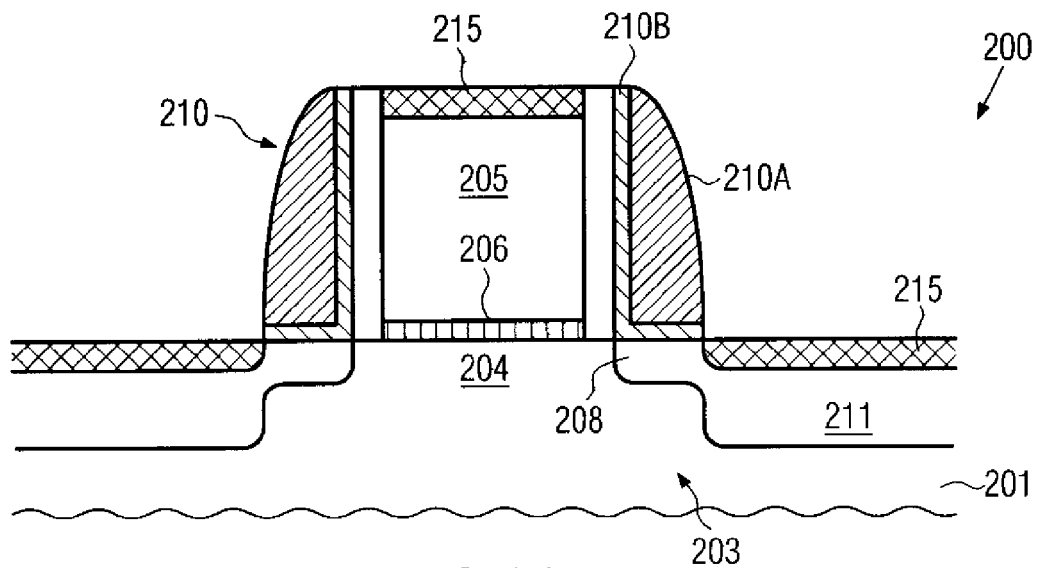

FIG. 2d schematically illustrates the transistor 200 in a further advanced manufacturing stage. Metal silicide regions 215 may be formed in the gate electrode 205 and in the drain and source regions 211, wherein any appropriate metal, such as nickel, cobalt, titanium, tungsten, platinum and the like, or any combinations thereof, may be used for forming the respective metal silicide regions 215. Moreover, in this manufacturing stage, the transistor 200 may have experienced one or more anneal processes so as to activate dopant atoms and also re-crystallize damaged semiconductor areas in the active region 203. Depending on the process strategy and the device requirements, one or more respective anneal processes may be carried out, for instance prior to the silicidation process when elevated temperatures, for instance in the range of approximately 600-800° C. may be required for efficiently re-crystallizing any lattice damage. Furthermore, even higher temperatures may be used in order to also efficiently activate the respective dopant species. As previously explained, depending on the process temperature and duration of respective anneal processes, a certain degree of diffusion activity may occur, thereby "pushing" the extension regions into the channel region 204. A respective dopant migration into the adjacent dielectric material, i.e., the dielectric liner 210B, due to the specific modification or adjustment of the characteristics thereof, may be significantly reduced compared to conventional silicon dioxide liners, thereby reducing a loss of respective dopant atoms in the extension regions 208. As is well known, boron is a frequently used dopant species for P-channel transistors, wherein a corresponding loss of dopant material is more pronounced compared to respective N-channel transistors due to the high diffusivity of boron in silicon and silicon dioxide. Consequently, the dopant concentration in the extension region 208 may be maintained higher compared to conventional strategies, especially boron doped P-channel transistors, due to the provision of the dielectric liner 210B having the diffusion hindering characteristic. It should also be appreciated that sophisticated anneal techniques, such as laser-based or flash-based techniques, may be used in combination with the present invention, wherein a high degree of dopant activation may be achieved at a reduced diffusion activity so that respective anneal processes may be performed at any appropriate manufacturing stage, even after the formation of the metal silicide regions 215. However, even if a significantly reduced diffusion activity may be achieved during specified laser- or flash-based anneal processes, especially for boron doped transistor elements, a significant diffusion may occur during various other process steps performed at elevated temperatures, such as a re-crystallization of lattice damage, any heat treatment for the silicide process in forming the regions 215 and the like. Also, in these cases, a more efficient confinement of boron dopants with respect to a diffusion into the neighboring dielectric materials may be obtained. Consequently, irrespective of the specific process strategy and the transistor architecture considered, a significant reduction of out-diffusion of dopants from the extension region 208 may be accomplished, in particular for P-channel transistors, by providing the spacer structure 210 including the liner 210B of increased diffusion blocking characteristics.

Figure 2E:
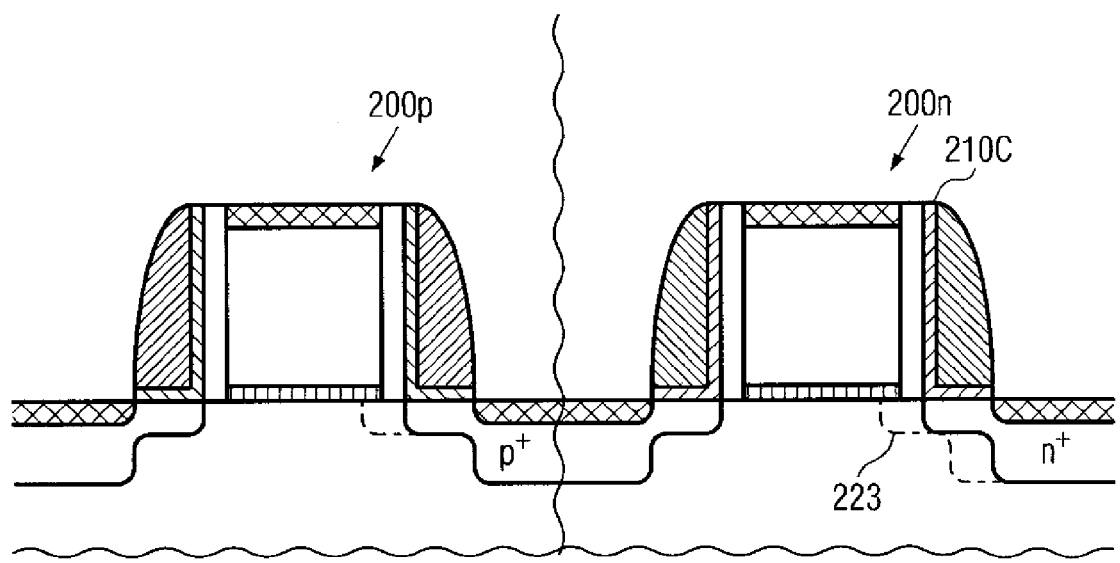
FIG. 2e schematically illustrates a semiconductor device comprising two different transistor elements having respective sidewall spacer structures with respective dielectric liners of different diffusion blocking characteristics according to yet other illustrative embodiments disclosed herein.

FIG. 2e schematically illustrates the semiconductor device 200 which may now comprise two different transistor elements 200p and 200n, wherein the transistor 200p may have substantially the same configuration as the semiconductor device 200 as shown in FIG. 2d, while the transistor 200n may have a configuration as is described with reference to the conventional transistor 100. In one illustrative embodiment, the transistor 200p may represent a P-channel transistor wherein the respective extension regions 208 comprise a high concentration of boron, while the transistor 200n may represent an N-channel transistor wherein the corresponding extension regions 208 may comprise any appropriate N-dopant, such as arsenic, phosphorous and the like. Typically, these N-type dopants may exhibit a significantly lower diffusivity compared to boron. Consequently, the dielectric liner 210B having the enhanced diffusion blocking characteristic as described above may provide a reduced boron out-diffusion from the extension region 208, while, in some embodiments, a respective dielectric liner 210C may lack the corresponding enhanced diffusion blocking characteristics. This may be advantageous as in some sophisticated applications so-called halo implantations may be performed, in which the dopant concentration of the channel region 204 in the vicinity of the respective PN junctions may be increased by introducing a respective dopant species. For instance, for the N-channel transistor, a respective P-doped halo region 223 may have been formed by ion implantation, in order to "reinforce" the respective PN junction formed between the halo region 223 and the extension region 208 so as to provide a more abrupt gradient at the respective PN junction. Consequently, the extension region 208 may also have incorporated therein a moderately high degree of P-dopant, although typically an order of magnitude less than the dopant concentration of the extension regions 208, which may therefore represent a counter dopant that may reduce the respective conductivity of the extension region 208. A similar configuration may also be used in the P-channel transistor 200p, wherein the respective halo region 223 may include a specific N-dopant. During any heat treatments, an enhanced out-diffusion of the P-dopant material from the extension region 208 of the N-channel transistor 200n may therefore reduce to a certain degree the counter doping and may thus contribute to an increase of the device performance. Consequently, a performance gain may be obtained for the transistor 200p, and to a certain degree for the transistor 200n, by selectively providing the dielectric liner 210C in the P-channel transistor 200p, while enabling a high P-dopant diffusion in the N-channel transistor 200n, since here typically the P-dopant may have an increased diffusivity compared to the N-dopant species, as previously explained.

The semiconductor device 200 as shown in FIG. 2e may be formed on the basis of substantially the same process techniques as previously described with reference to FIGS. 2a-2d, wherein, after forming the dielectric liner 210B as shown in FIG. 2b and prior to the modification process 220, a respective mask may be provided in order to cover the transistor 200n while exposing the transistor 200p. Consequently, the liner 210C may remain substantially untreated, while the liner 210B may receive the increased diffusion blocking characteristics. After the selective modification of the liner 210B, as shown in FIG. 2b, the further processing may be continued on the basis of well-established CMOS techniques.

Figure 2F:
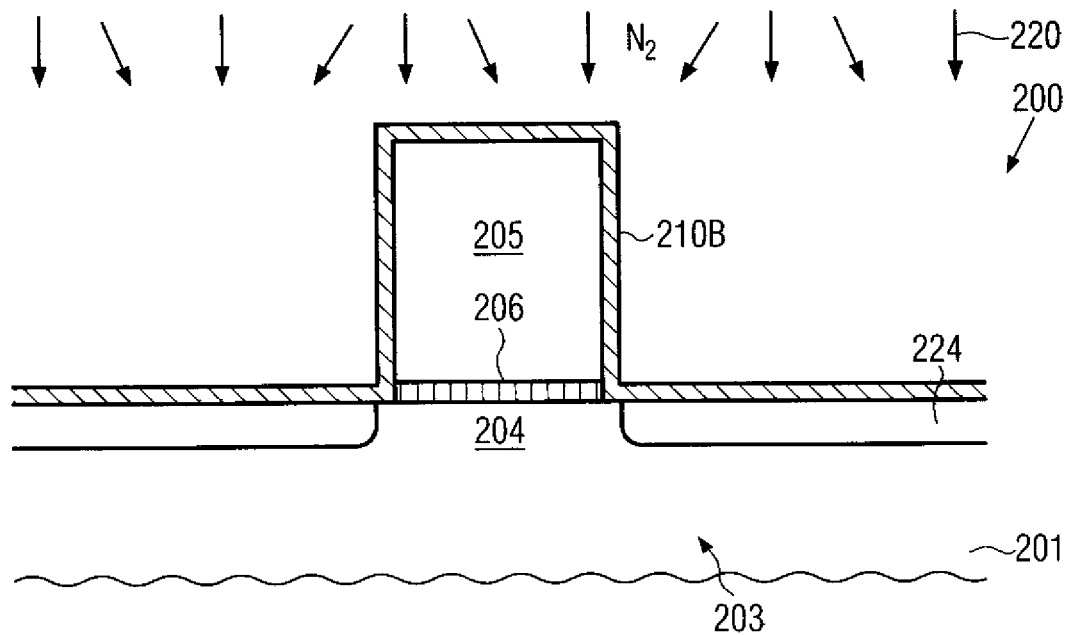
FIG. 2f schematically illustrates a cross-sectional view of a transistor element in an intermediate manufacturing stage for receiving a modified dielectric liner, wherein the transistor may include an epitaxially grown semiconductor material according to one illustrative embodiment disclosed herein.

FIG. 2f schematically illustrates the semiconductor device 200 according to still another illustrative embodiment wherein the device 200 representing a P-channel transistor may have incorporated therein a strained semiconductor material 224, such as silicon/germanium, in order to induce a respective strain in the channel region 204. The strained semiconductor material 224 may be provided as an in situ doped material, for instance comprising a specific amount of boron, or the material 224 may be provided as a substantially intrinsic semiconductor material, wherein the respective incorporation of a P-type dopant may be accomplished on the basis of implantation processes, as are previously described. Irrespective of the specific manufacturing process, the dielectric liner 210B may be provided and may be treated by the process 220 so as to obtain the desired diffusion blocking characteristics in order to significantly reduce the out-diffusion of the P-dopant during subsequent process steps requiring elevated temperatures.

Figure 2G:
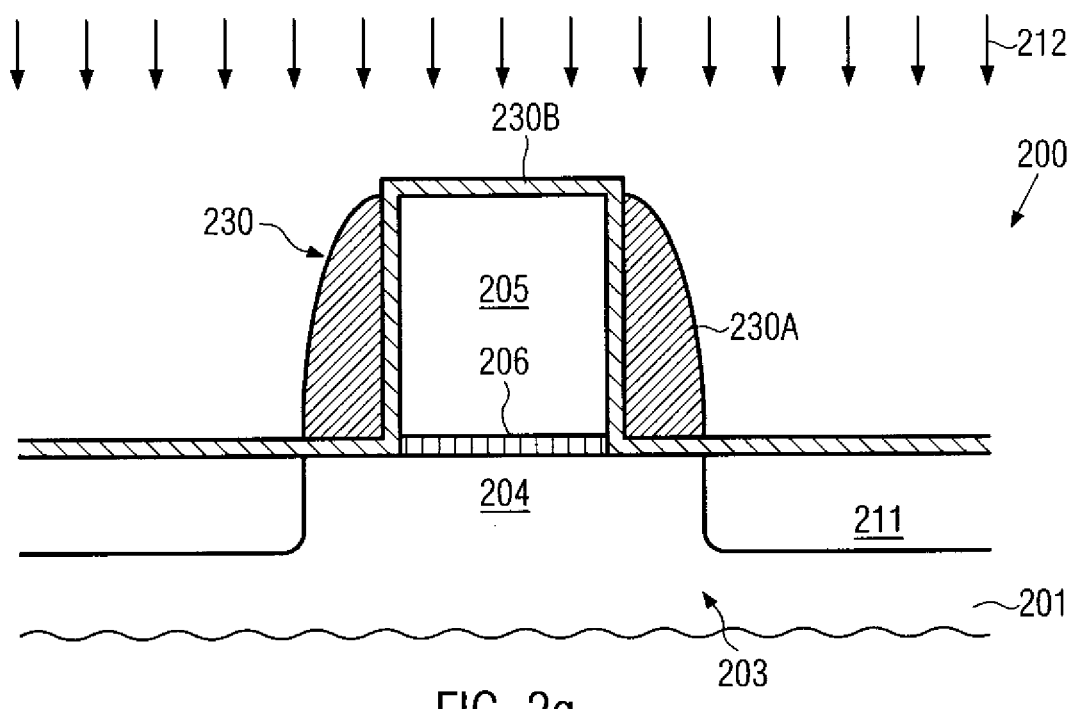
FIGS. 2g-2h schematically illustrate cross-sectional views of a transistor element receiving a modified dielectric liner after forming drain and source regions and respective extension regions according to illustrative embodiments disclosed herein.

FIG. 2g schematically illustrates the semiconductor device 200 according to yet other illustrative embodiments. In the manufacturing stage shown in FIG. 2g, the device may comprise a respective sidewall spacer structure 230 which may be comprised of a silicon dioxide liner 230B and a silicon nitride spacer 230A formed in accordance with well-established techniques, which may be used as an implantation mask for the ion implantation 212 for forming the deep drain and source regions 211. Thereafter, the spacer structure 230 may be removed on the basis of well-established etch techniques, for instance by selectively etching the spacer 230A with respect to the liner 230B and subsequently removing the liner 230B.

Figure 2H:
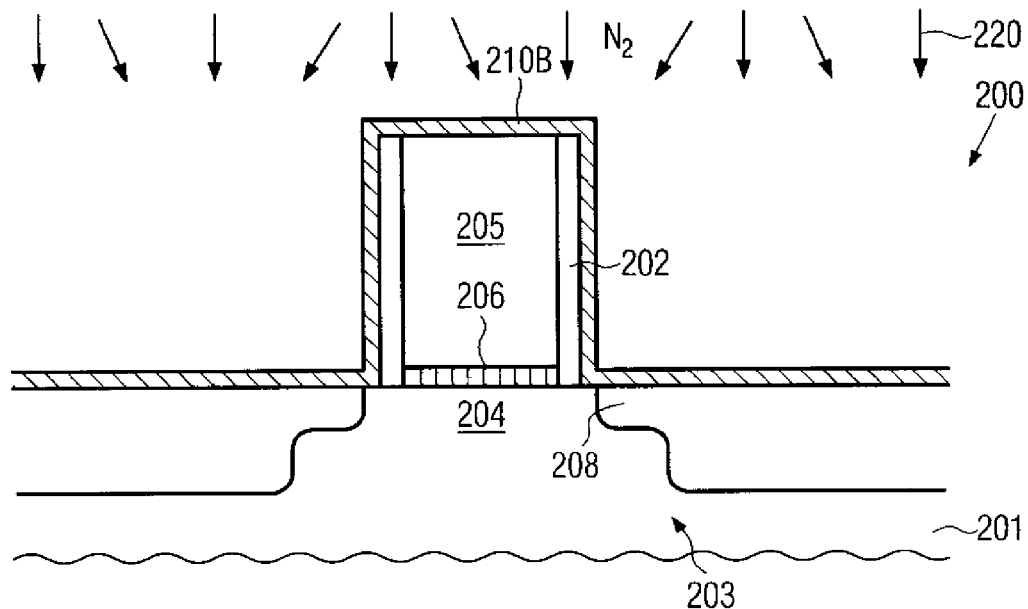

FIG. 2h schematically illustrates the semiconductor device 200 in a further advanced manufacturing stage after the removal of the spacer structure 230. The device 200 may now comprise a sidewall spacer structure 202, on the basis of which the extension regions 208 may be formed by an appropriate implantation process, as previously described. Thereafter, the liner 210B may be formed and may be treated by the process 220 so as to exhibit the desired diffusion blocking characteristics, as are previously explained. Thereafter, the further processing may be continued by forming a respective sidewall spacer structure including the dielectric liner 210B, which may then be used for forming respective metal silicide regions, such as the regions 215 as shown in FIG. 2d. It should be appreciated that, even in this process sequence, in which appropriate anneal processes may be performed prior to actually forming a dielectric material on the extension regions 208, a significant performance gain may be obtained since a boron out-diffusion may be reduced during any further process steps requiring elevated temperatures, such as the silicidation process. Consequently, a significant reduction of dopant loss from the respective extension regions, in particular of P-channel transistors, may be accomplished for a plurality of transistor configurations and process strategies, while nevertheless a high degree of compatibility with respective conventional approaches may be maintained.

Figure 3A:
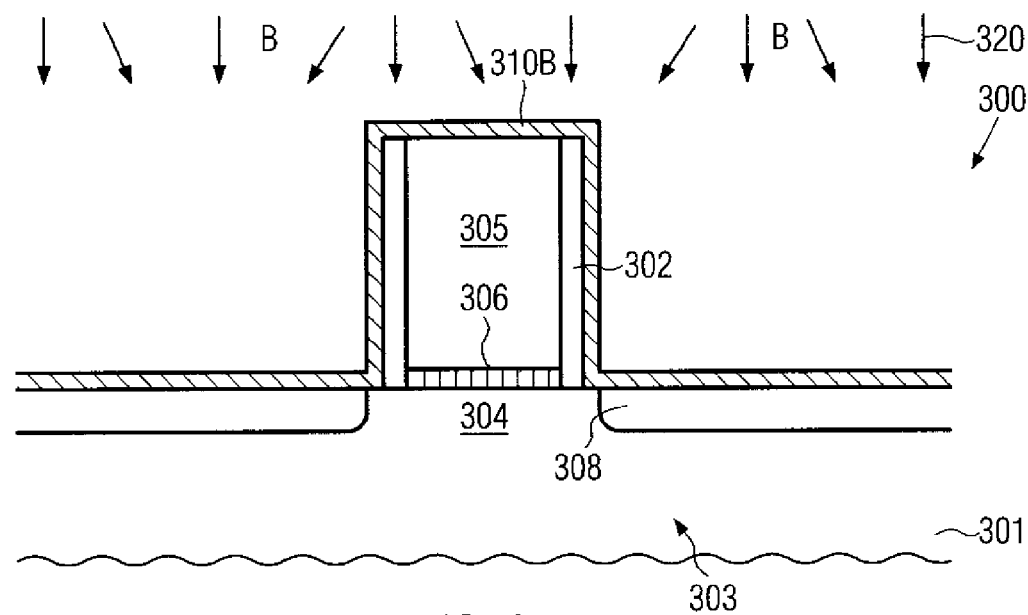
FIGS. 3a-3b schematically illustrate cross-sectional views of a transistor element, in which a dielectric liner is modified by incorporating a dopant species according to illustrative embodiments disclosed herein.
Figure 3B:
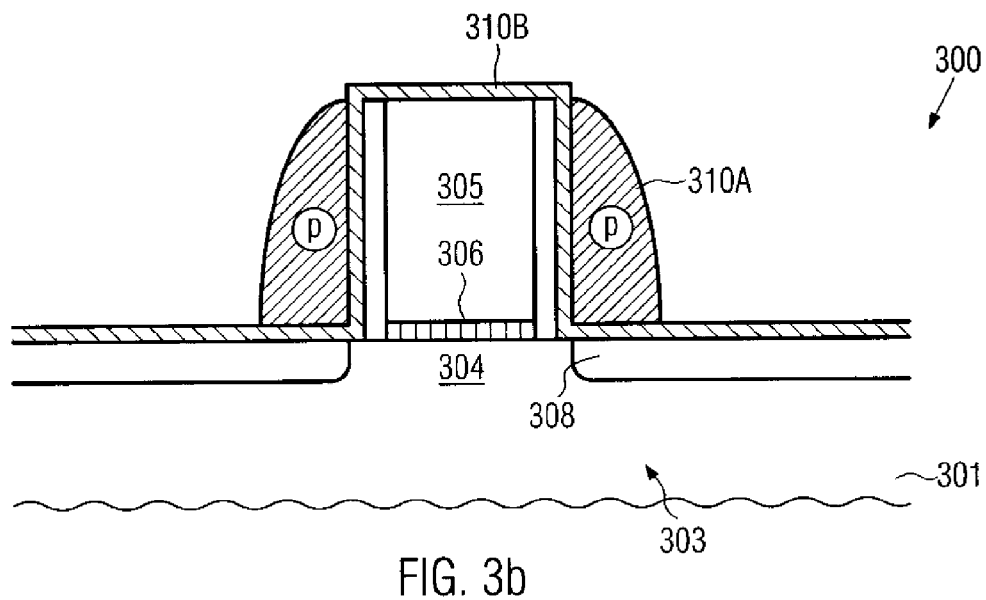

With reference to FIGS. 3a-3b, further illustrative embodiments will now be described in which a highly doped dielectric material and/or a non-silicon dioxide material may be used in a corresponding spacer structure.

FIG. 3a schematically illustrates a semiconductor device 300, representing a transistor element formed above a substrate 301, in which is defined an active region 303. A gate electrode 305 may be formed above a channel region 304 and may be separated therefrom by a gate insulation layer 306.

Furthermore, a spacer structure 302 may be formed on sidewalls of the gate electrode 305. Furthermore, a dielectric liner 310B may be formed on respective extension regions 308 and on the gate electrode 305. Except for the dielectric liner 310B, the semiconductor device 300 may substantially correspond to the device 200 as shown in FIG. 2a. The dielectric liner 310B may be provided as a dielectric material having incorporated therein a high concentration of a specified dopant species, such as boron, wherein the specified dopant species may be substantially the same as the dopant species defining the extension region 308. In one illustrative embodiment, the dielectric liner 310B may be provided as a silicon dioxide layer having incorporated therein a concentration of approximately $10^{19}$-$10^{21}$ atoms/cm$^3$. The dielectric liner 310B may be formed by any appropriate deposition technique, wherein, in some illustrative embodiments, the respective dopant species may be introduced into the respective deposition ambient by providing any appropriate precursor gas. In other illustrative embodiments, the dielectric liner 310B may be deposited on the basis of well-established techniques and subsequently a modification process 320 may be performed in order to introduce the dopant species into the liner 310B. For this purpose, an appropriate plasma ambient may be established, wherein an appropriate precursor gas may be used for introducing the dopant species into the layer 310B. Thereafter, the further processing may be continued by depositing a specific spacer material, such as silicon nitride, and patterning the spacer material on the basis of the liner 310B in accordance with well-established spacer techniques.

FIG. 3b schematically illustrates the semiconductor device 300 with correspondingly formed spacer elements 310A, which may be comprised of silicon nitride, wherein, in some illustrative embodiments, also the spacers 310A may comprise a moderately high dopant concentration, while, in other embodiments, a substantially undoped dielectric material may be used. Thereafter, the further processing may be continued as is previously described, for instance by forming respective drain and source regions on the basis of the spacer elements 310A. During any treatment at elevated temperatures, for instance for re-crystallizing implantation-induced damage, activating dopants and the like, a dopant gradient between the liner 310B and the extension region 308 may be significantly reduced compared to conventional strategies, thereby also reducing the diffusion rate of dopant species from the extension region 308 into the neighboring dielectric liner 310B. Consequently, a higher dopant concentration may be maintained within the extension regions 308. In some illustrative embodiments, the dopant concentration in the liner 310B may even be higher compared to the extension region 308 and hence a dopant diffusion into the extension region 308 may occur during elevated temperatures, thereby enhancing the conductivity thereof. When the spacer elements 310A are also provided as a highly doped dielectric material, an unwanted out-diffusion of the dopant species from the liner 310B into the spacer 310A may be avoided or may at least be significantly reduced. Even if the spacers 310A are provided as a substantially undoped material, the diffusion of dopants into the spacers 310A is significantly lower compared to the diffusion into the extension region 308 due to the enhanced diffusion blocking characteristics of the spacers 310A, which may be formed of silicon nitride.

Figure 3C:
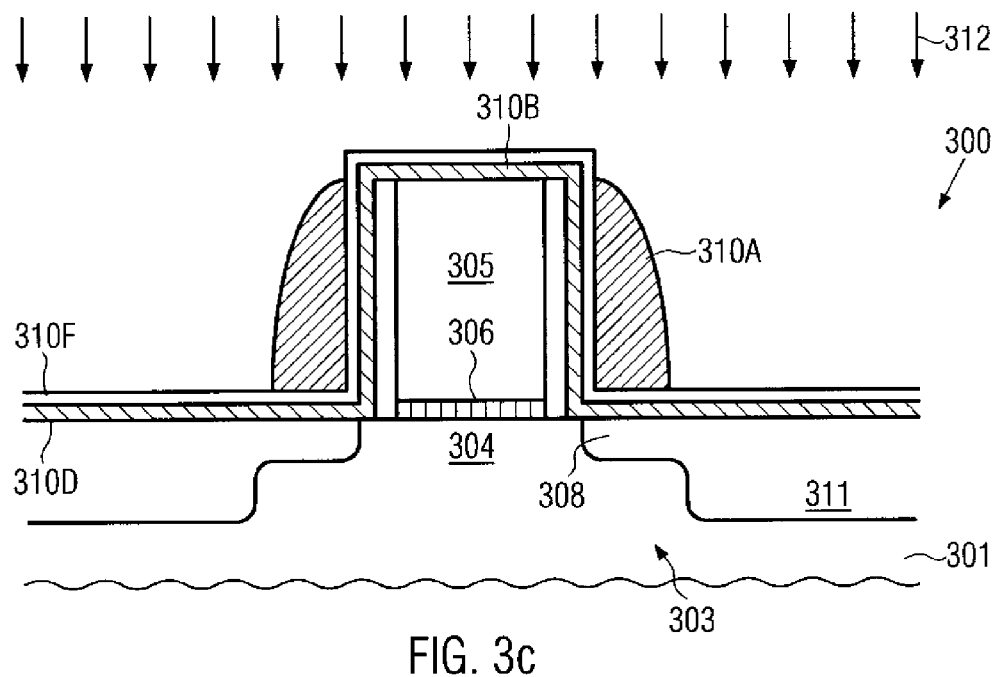
FIG. 3c schematically depicts a transistor including a dielectric liner comprising a plurality of sub-layers for appropriately adjusting the diffusion blocking characteristics thereof according to yet other illustrative embodiments disclosed herein.

FIG. 3c schematically illustrates the semiconductor device 300 in accordance with yet other illustrative embodiments, wherein a spacer structure 310 may comprise the spacer element 310A, for instance comprised of silicon nitride, and the liner 310B, which may include a plurality of sub-layers 310D, 310F, at least one of which may be formed of a material having a high blocking characteristic with respect to a specified dopant species, such as boron. In one illustrative embodiment, the sub-layer 310D may be comprised of silicon nitride, while the sub-layer 310F may be comprised of silicon dioxide. Consequently, in this way, a high degree of etch selectivity of the liner 310B with respect to the material of the spacer element 310A may be accomplished, while on the other hand a high diffusion blocking characteristic is provided with respect to the extension region 308 due to the significantly reduced diffusivity of, for instance, boron in silicon nitride.

The dielectric liner 310B may be formed on the basis of the following processes. First, the silicon nitride layer 310D may be deposited on the basis of well-established deposition techniques, such as plasma enhanced CVD, wherein a layer thickness is less critical as long as a desired total thickness of the spacer structure 310 may be achieved. Thereafter, the silicon dioxide layer 310F may be deposited on the basis of plasma enhanced CVD and the like, wherein a moderately thin thickness may be used so as to provide the required etch selectivity while not unduly compromising device performance due to the relative permittivity of the silicon dioxide. Next, silicon nitride may be deposited and may then be anisotropically etched to form the spacer elements 310A, wherein the layer 310F may be used as an efficient etch stop layer. Based on the spacer structure 310, an implantation process 312 may be performed in order to define the drain and source regions 311. The dielectric liner 310B may be removed from exposed device portions by first selectively removing the silicon dioxide layer 310F, followed by a selective etch process for removing the sub-layer 310D, wherein the size of the spacer elements may also be reduced, which may even be advantageous with respect to the formation of metal silicides in a later manufacturing stage.

Consequently, an efficient mechanism for reducing the out-diffusion of dopant material into neighboring dielectric spacer structures may be accomplished, wherein, in some illustrative embodiments, even an increase of dopant concentration may be accomplished in the respective extension regions. It should also be appreciated that the embodiments described with reference to FIGS. 3a-3c may also be combined with any of the previously described embodiments. That is, the dielectric liner 310B as shown in FIGS. 3a-3b may also be modified so as to include a certain amount of nitrogen, as previously described, and/or the dielectric liner 310B of FIGS. 3a-3b may be used in any process strategy and transistor configuration as previously described with reference to FIGS. 2a-2h. Similarly, the liner 310B as shown in FIG. 3c may be used in any transistor configuration and process strategy, as previously described. Moreover, the increased contents of, for instance, nitrogen in a silicon dioxide base material of the liners may increase the relative permittivity, thereby also contributing to an enhanced performance.

Figure 4A:
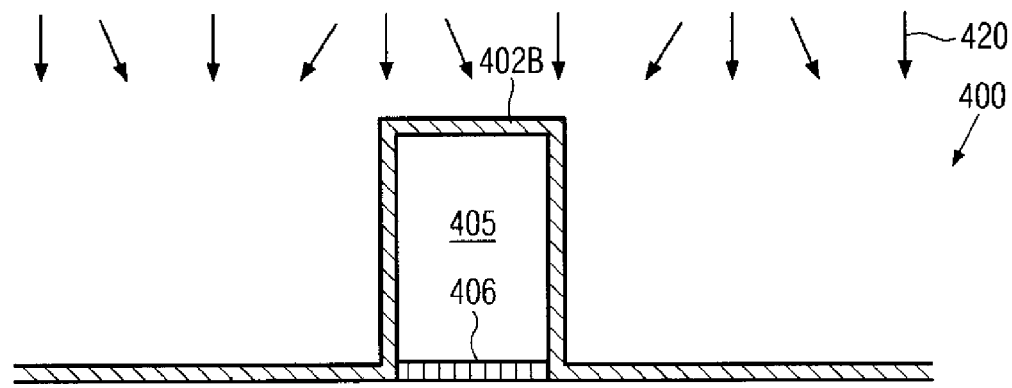
FIGS. 4a-4c schematically illustrate cross-sectional views of a transistor element in an early manufacturing stage prior to the implantation of extension regions, wherein a respective offset spacer structure may reduce a diffusion rate of boron in later manufacturing stages according to further illustrative embodiments disclosed herein.
Figure 4B:
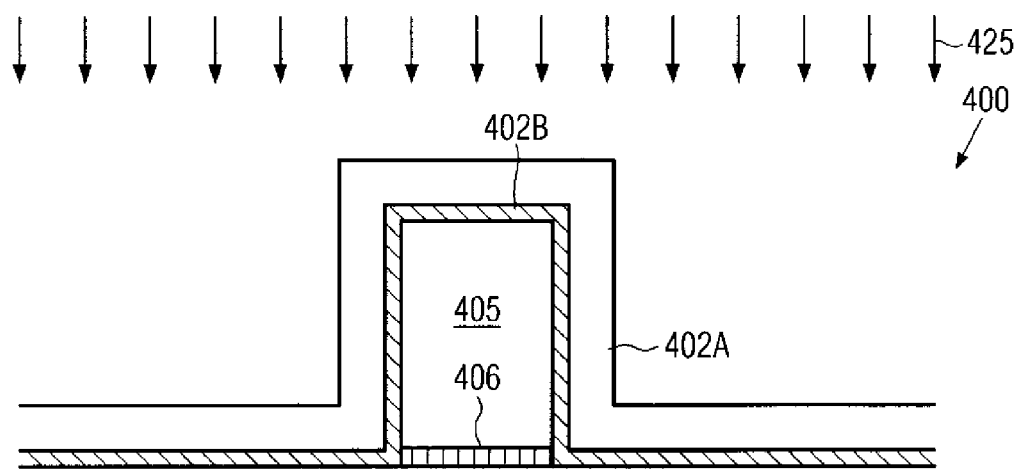
Figure 4C:
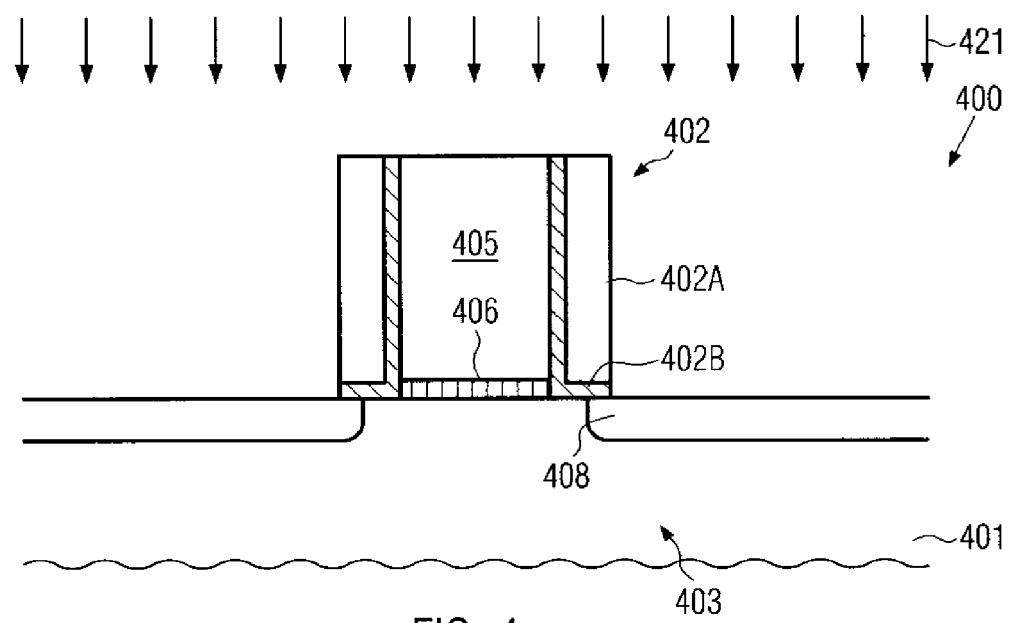

With reference to FIGS. 4a-4c, further illustrative embodiments of the present invention will now be described, in which a spacer structure for defining extension regions may additionally or alternatively obtain diffusion reducing characteristics.

FIG. 4a schematically illustrates a semiconductor device 400 comprising a substrate 401 having formed therein an active region 403 in which is defined a channel region 404. A gate electrode 405 is formed above the channel region 404 and is separated therefrom by a gate insulation layer 406. Regarding the components described so far, the same criteria apply as previously explained with reference to the devices 100, 200 and 300. Furthermore, the device 400 may comprise a dielectric liner 402B, which exhibits an increased diffusion blocking effect compared to a pure silicon dioxide material, as is previously explained. For instance, the dielectric liner 402B may represent a silicon dioxide base material having incorporated therein a specified amount of nitrogen. In one illustrative embodiment, the dielectric liner 402B may be deposited in the form of a silicon dioxide material and/or may be formed by an oxidation process and may be subjected to a modification process 420, such as a nitridation process, as is previously described.

FIG. 4b schematically illustrates the device 400 which comprises a spacer layer 402A, which may be comprised of silicon nitride that is conformally formed on the dielectric liner 402B. The layer 402A may be subjected to an anisotropic etch process 425 in order to remove material of the layer 402A from horizontal device portions, wherein the dielectric liner 402B acts as an efficient etch stop layer.

FIG. 4c schematically illustrates the device 400 during an ion implantation process 421 for defining respective extension regions 408 in the active region 403, wherein respective spacer elements formed from the layer 402A, which are for convenience also referred to as spacers 402A, act as an implantation mask. Thereafter, the further processing may in some embodiments be continued as is for instance described with reference to the devices 200 and 300. That is, a respective spacer structure for defining deep drain and source regions may be formed in addition to the spacer structure 402 such that a dielectric material having the enhanced diffusion blocking property is provided across the entire surface portion of the extension region 408, thereby even more effectively reducing any out-diffusion of dopant species into the neighboring dielectric spacer structure, in particular when P-channel transistors are considered, having incorporated therein a high concentration of boron.

As a result, the subject matter disclosed herein may provide significantly reduced out-diffusion of dopant species from respective extension regions by appropriately adapting the characteristics of an adjacent dielectric material of a spacer structure. In some aspects, at least one spacer structure may comprise a dielectric material in contact with the respective extension region, wherein an increased amount of diffusion blocking material may provide reduced diffusion activity compared to a standard silicon dioxide material, as is typically used in conventional approaches. In other illustrative embodiments, the dopant gradient between the extension region and the adjacent dielectric material may be significantly reduced or even inverted so as to also reduce or even reverse the diffusion rate of a specific dopant species. In some embodiments, more than one spacer structure may be provided with the enhanced diffusion blocking capabilities in order to significantly reduce dopant out-diffusion across the entire interface between the dielectric material and doped semiconductor material, in which is not formed a corresponding metal silicide material. Thus, transistor performance may be significantly enhanced while nevertheless a high degree of compatibility with conventional spacer techniques may be maintained, since the etch selectivity of the respective dielectric liner may not be unduly compromised.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a dielectric liner above a substrate including a first gate electrode formed above an active region and separated therefrom by a gate insulation layer;
   modifying said dielectric liner so as to have an increased diffusion blocking capability for a dopant species relative to an unmodified layer of such material;
   forming a sidewall spacer for said first gate electrode using said dielectric liner as an etch stop layer; and
   forming drain and source regions in said active region by implanting said dopant species into said active region using at least said gate electrode as a mask, wherein said dopant species comprises a P-type dopant species.

2. The method of claim 1, wherein modifying said dielectric liner comprises introducing nitrogen into said dielectric liner.

3. The method of claim 1, wherein said dopant species comprises boron.

4. The method of claim 1, wherein said dielectric liner comprises silicon dioxide.

5. The method of claim 1, wherein modifying said dielectric liner comprises introducing said dopant species into said dielectric liner.

6. The method of claim 1, further comprising forming at least one further sidewall spacer for said first gate electrode, using at least one further dielectric liner as an etch stop layer, wherein said at least one further liner is modified so as to reduce a probability for said dopant species in said active region to diffuse into said at least one further dielectric liner.

7. The method of claim 6, further comprising forming extension regions by introducing said dopant species into said active region using said at least one further sidewall spacer as a mask.

8. The method of claim 1, further comprising forming extension regions in said active region by introducing said dopant species into said active region.

9. The method of claim 8, wherein said drain and source regions are formed prior to forming said extension regions.

10. The method of claim 9, wherein said drain and source regions are formed after said extension regions using said sidewall spacer as an implantation mask.

11. The method of claim 1, wherein said substrate comprises a second gate electrode formed above a second active region, and said method further comprises forming a second sidewall spacer for said second gate electrode by using said dielectric liner in a non-modified state.

12. A method, comprising:
    forming a sidewall spacer structure for a gate electrode of a first transistor by using a dielectric liner as an etch stop layer, said dielectric liner comprising at least a portion causing a lower diffusivity of a specified dopant species compared to a diffusivity of said specified dopant species in silicon dioxide and
    forming drain and source regions of said first transistor by implanting said dopant species into said active region using at least said gate electrode as a mask, wherein said dopant species comprises a P-type dopant species.

13. The method of claim 12, wherein forming said sidewall spacer structure comprises forming said dielectric liner so as to comprise nitrogen at least in said portion.

14. The method of claim 13, wherein said nitrogen is incorporated by performing a nitridation process.

15. The method of claim 14, wherein forming said dielectric liner comprises forming a silicon dioxide containing layer.

16. The method of claim 13, wherein forming said dielectric liner comprises forming a first sub-layer comprising nitrogen and forming a second sub-layer comprising silicon dioxide.

17. The method of claim 12, wherein said specified dopant species is boron.

18. A transistor device, comprising:
a gate electrode formed next to a channel region;
a gate insulation layer formed between said gate electrode and said channel region; and
a spacer structure formed adjacent to said gate electrode and connecting to an extension region, said spacer structure comprising a spacer element and a dielectric liner that is in contact with said extension region, at least a portion of said dielectric liner providing a rate of diffusion of a specified dopant species from said extension region into said dielectric liner that is less than a rate of diffusion of said specified dopant species for silicon dioxide, wherein said dopant species comprises a P-type dopant species, and said transistor comprises a P-type transistor.

19. The transistor device of claim 18, wherein said dielectric liner comprises silicon dioxide and nitrogen.

20. The transistor device of claim 18, wherein said dielectric liner is doped with said specified dopant species.

* * * * *